US012757346B2

(12) United States Patent
Keul et al.

(10) Patent No.: US 12,757,346 B2
(45) Date of Patent: Oct. 6, 2026

(54) INLAY ELEMENT, A MODULE TERMINATION UNIT, AN INPUT/OUTPUT DEVICE, A MODULAR PROCESS CONTROL SYSTEM AND A METHOD FOR ASSEMBLING AN INPUT/OUTPUT DEVICE

(71) Applicant: ABB Schweiz AG, Baden (CH)

(72) Inventors: Thomas Keul, Freigericht (DE); Can Ozer, Västerås (SE); Malte Ehlenbroeker, Bad Salzuflen (DE); Martin Rydberg, Västerås (SE); Sean-Lei Wang, Shanghai (CN)

(73) Assignee: ABB Schweiz AG, Baden (CH)

( * ) Notice: Subject to any disclaimer, the term of this patent is extended or adjusted under 35 U.S.C. 154(b) by 245 days.

(21) Appl. No.: 18/321,945

(22) Filed: May 23, 2023

(65) Prior Publication Data

US 2023/0380094 A1 Nov. 23, 2023

(30) Foreign Application Priority Data

May 23, 2022 (EP) .................................... 22174770

(51) Int. Cl.
*H05K 7/14* (2006.01)

(52) U.S. Cl.
CPC .................................. *H05K 7/1479* (2013.01)

(58) Field of Classification Search
None
See application file for complete search history.

(56) References Cited

U.S. PATENT DOCUMENTS

| | | | | | |
|---|---|---|---|---|---|
| 9,089,067 | B2 * | 7/2015 | Gaub | H05K 7/1478 |
| 9,456,518 | B2 * | 9/2016 | Bury | H05K 7/1472 |
| 10,141,859 | B2 * | 11/2018 | Aporius | H01R 25/006 |
| 11,314,493 | B1 * | 4/2022 | Stump | G05B 19/4188 |
| 2004/0024939 | A1 * | 2/2004 | Hoeing | H05K 7/1472<br>710/300 |

FOREIGN PATENT DOCUMENTS

| | | | | |
|---|---|---|---|---|
| CN | 207368342 U | | 5/2018 | |
| DE | 19807710 A1 | | 9/1999 | |
| DE | 10135980 C1 | * | 4/2003 | G05B 15/02 |
| DE | 202017103820 U1 | | 8/2017 | |
| DE | 202017103824 U1 | | 8/2017 | |
| DE | 202017103828 U1 | | 8/2017 | |
| EP | 2986093 A1 | * | 2/2016 | H05K 7/1465 |

(Continued)

OTHER PUBLICATIONS

Budde et. al (EP 2986093 A1) (Year: 2016).*
(Continued)

*Primary Examiner* — Hung S. Bui
*Assistant Examiner* — Elisa Sasserath
(74) *Attorney, Agent, or Firm* — Fitch Even Tabin & Flannery LLP

(57) ABSTRACT

An inlay element configured to be arranged in a module termination unit of a modular process control system includes a first connector section and a second connector section, wherein the first connector section is configured to be connected to at least one controller module and wherein the second connector section is configured to be connected to at least one fieldbus device.

10 Claims, 2 Drawing Sheets

(56) References Cited

FOREIGN PATENT DOCUMENTS

| | | | | |
|---|---|---|---|---|
| EP | 2986093 B1 * | 6/2017 | ......... | H01R 12/7076 |
| EP | 3331334 B1 | 5/2021 | | |
| TW | 383900 U | 7/2010 | | |

OTHER PUBLICATIONS

Budde et. al (EP 2986093 A1) (Year: 2015).*
Huck (DE 10135980 C1) (Year: 2003).*
European Patent Office, Extended European Search Report in European Patent Application No. 22174770.2, 9 pp. (Nov. 17, 2022).
Office Action and Search Report in corresponding Chinese Application No. 202310583611.2; dated May 14, 2026; 4 pages.

* cited by examiner

INLAY ELEMENT, A MODULE TERMINATION UNIT, AN INPUT/OUTPUT DEVICE, A MODULAR PROCESS CONTROL SYSTEM AND A METHOD FOR ASSEMBLING AN INPUT/OUTPUT DEVICE

CROSS-REFERENCE TO RELATED APPLICATIONS

This patent application claims priority to European Patent Application No. 22174770.2, filed on May 23, 2022, which is incorporated herein in its entirety by reference.

FIELD OF THE DISCLOSURE

The present disclosure generally relates to an inlay element configured to be arranged in a module termination unit, a module termination unit, an input/output device, a modular process control system and a method for assembling an input/output device.

BACKGROUND OF THE INVENTION

Process control systems are generally known in the prior art. Process control systems comprise several different hardware units, for example, at least one I/O module with several signal conditioning units, a power source, a communication interface unit, a module terminal unit and a control unit. Process control systems are used among others to control complex production plants, e.g. in process industry or automobile industry. For example, such a system was developed by the applicant under the type designation ABB Ability System 800xA Select I/O. In practice, a process control system comprises several different field devices, which are connected with the I/O modules on the module termination unit.

It has now become apparent, due to the wide range of applications, that there is a need to provide further means to improve the modularity of process control systems.

In view of the above, it is an object of the present invention to provide further means to improve the modularity of process control systems. It is in particular an object of the invention to provide an inlay element which allows a flexible configurations of a module termination unit.

BRIEF SUMMARY OF THE INVENTION

According to a first aspect of the present disclosure, an inlay element is provided comprising: a first connector section and a second connector section, wherein the first connector section is configured to be connected to at least one controller module and wherein the second connector section is configured to be connected to at least one fieldbus device and/or a control network.

The term controller module is to be understood broadly. That means a controller module may be for example a module for controlling input/output units or a fieldbus communication interface.

The inlay element is a separate component from the module termination unit. As such, the inlay element may be distributed separately. In an assembled state, the inlay element is removable connected to the module termination unit. This means, the inlay element may be replaced in case of an error or malfunction.

The first connector section comprises at least one connection means for an controller module. The second connector section comprises at least one connection means for a field bus device and/or a control network. There may be different possible configurations of the first connector section and second connector section. In other words the first and second connector sections may be customized for a specific input/output device or fieldbus device.

BRIEF DESCRIPTION OF THE SEVERAL VIEWS OF THE DRAWING(S)

The accompanying drawings, which are included to provide a further understanding of the invention and are incorporated in and constitute a part of this application, illustrate embodiments of the invention and together with the description serve to explain the principle of the invention.

DETAILED DESCRIPTION OF THE INVENTION

Figure 1:
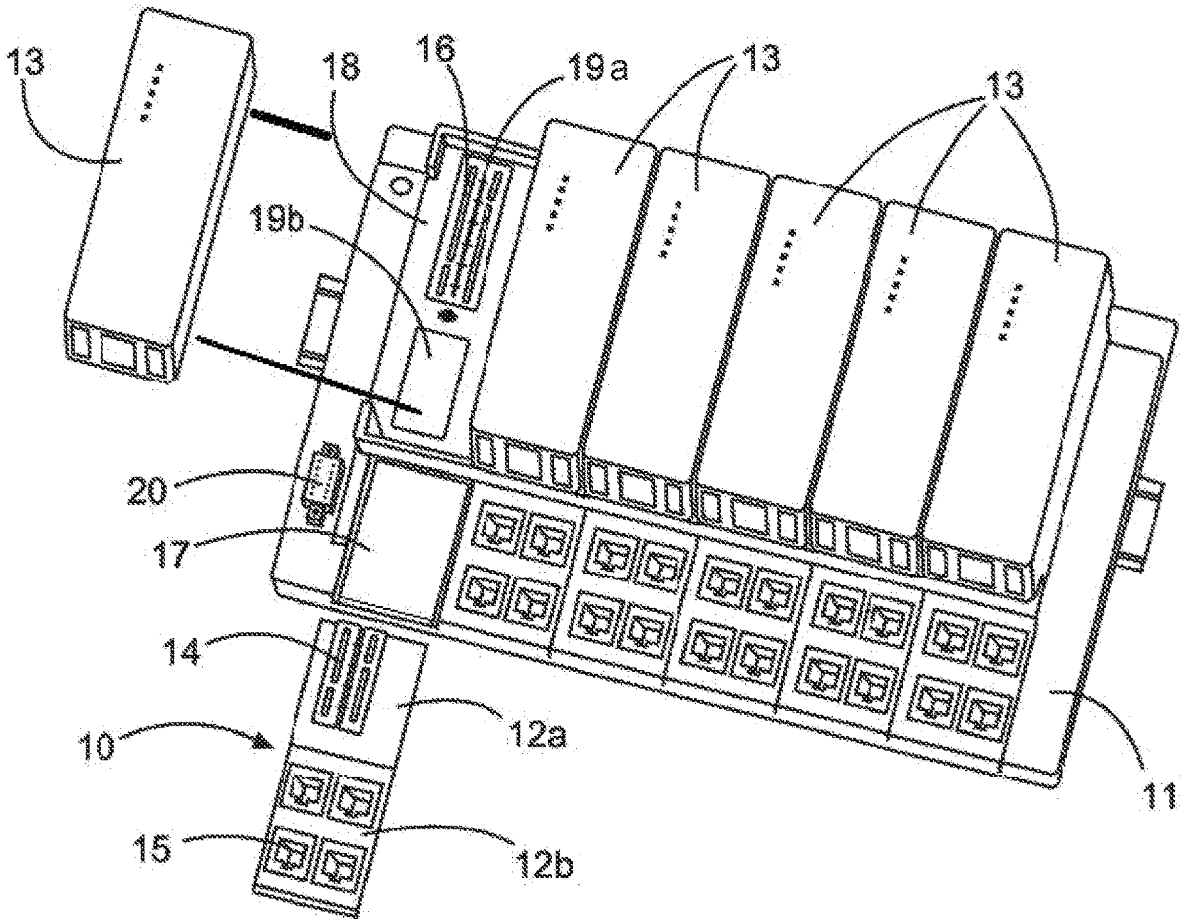
FIG. 1 is a perspective view of a schematic drawing of a module termination unit with controller modules and inlay elements.

FIG. 1 shows a schematic drawing of a module termination unit 11. The module termination unit 11 has a rectangular geometry with longitudinal and transverse sides. Other forms may be possible.

The module termination unit 11 may comprises six connection ports 16. The connection ports 16 may have two adjacent connection slots as exemplary shown in FIG. 1. In alternative embodiments, a different number of connection ports 16 and connection slots and also a different arrangement may be present.

The module termination unit 11 further comprises a recess 17. The geometry of the recess 17 in configured to house a total of six inlay elements 10. Alternatively, the recess 17 may be configured to house a different number of inlay elements 10. Therefore, for each inlay element 10 one recess 17 may be provided. In other words, embodiments with multiple recesses 17 for one or more inlay elements 10 are possible.

In FIG. 1, five inlay elements 10 are housed in the recess 17. A sixth inlay element 10 is arranged beside the module termination unit 11. The sixth inlay element 10, on the bottom left, is in a state right before it is arranged in the recess 17 of the module termination unit 11. This demonstrates, that the inlay elements 10 are separate components from the module termination unit 11. The inlay elements 10 are arranged removable in the recess 17. All six inlay elements 10 shown in FIG. 1 are identical to each other.

The inlay element 10 is provided by a plate with a rectangular form. Other forms are possible. The inlay element 10 comprises a first connector section 12*a* and a second connector section 12*b*. The first connector section 12*a* and the second connector section 12*b* each take up a part of the inlay element 10, in particular in longitudinal direction. The first connector section 12*a* of the inlay element 10 comprises an connection interface 14. The second connector section 12*b* of the inlay element 10 comprises a fieldbus connection interface 15. Here, all inlay elements 10 comprise RJ45 sockets as fieldbus connection interfaces 15. Different fieldbus connection interfaces may be provided.

In the embodiment according to FIG. 1, the module termination unit 11 comprises a plate element 18. The plate element 18 is arranged on the module termination unit 11, e.g. by screws. The plate element 18 overlaps with the connection ports 16 of the module termination unit 11. The plate element 18 has first cut-outs 19*a*. The first cut-outs 19*a* correspond with the connection ports 16 of the module termination unit 11. In other words, in an assembled state, the connection ports 16 are arranged in and/or under the respective first cut-outs 19*a*.

The plate element 18 further comprises second cut-outs 19*b*. The second cut-outs 19*b* correspond with the connection interfaces 14 of the inlay elements 10. In other words, in an assembled state, the connection interfaces 14 of the inlay elements 10 are arranged in and/or under the second cut-outs 19*b*.

The inlay elements 10 are configured to slide into the recess 17 and under the plate element 18 until its input/output connection interfaces 14 are arranged in and/or under the respective second cut-out 19*b*. The inlay element 10 may be connected to the module termination unit 11 by form fitting, e.g. a latching mechanism. As stated above, the inlay element 10 is configured, so it can be removed from the module termination unit 11.

Five controller modules 13 are arranged on the module termination unit 11 via the connection ports 16. One controller module 13 is arranged beside the module termination unit 11 on the far left of FIG. 1. The controller modules 13 are arranged on the plate element 18. The plate element 18 comprises a collar 20, which extends along the longitudinal sides of the plate element 18 and partially along the transverse side of the plate element 18. The transverse side of the plate element 18 is mostly collar free.

In an assembled state, the controller modules 13 are connected to the module termination unit 11 by the respective connection ports 16 and to the inlay elements 10 by the respective connection interfaces 14. In this way, each controller module 13 can be connected to a respective fieldbus device (not shown) by connecting the fieldbus device with the fieldbus connection interface 15 of the respective inlay element 10.

Figure 2:
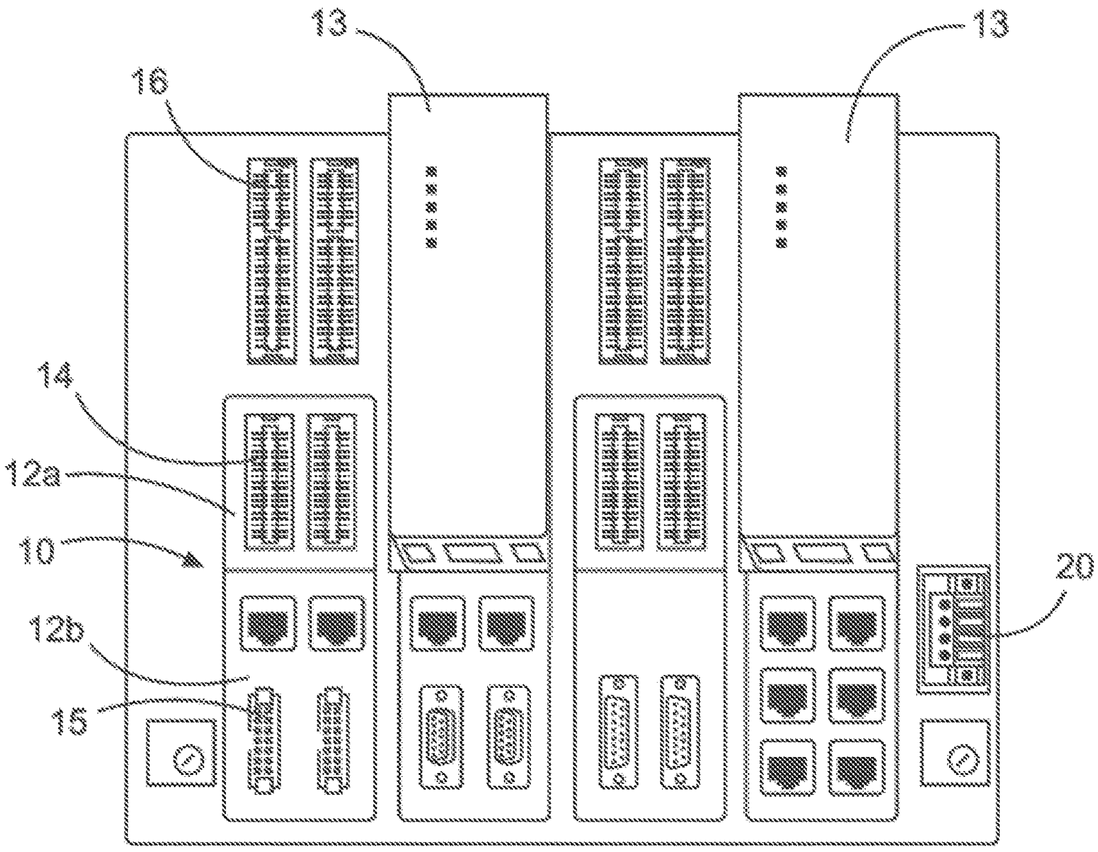
FIG. 2 is a top view of a schematic drawing of a module termination unit with controller modules and inlay elements.
Figure 3:
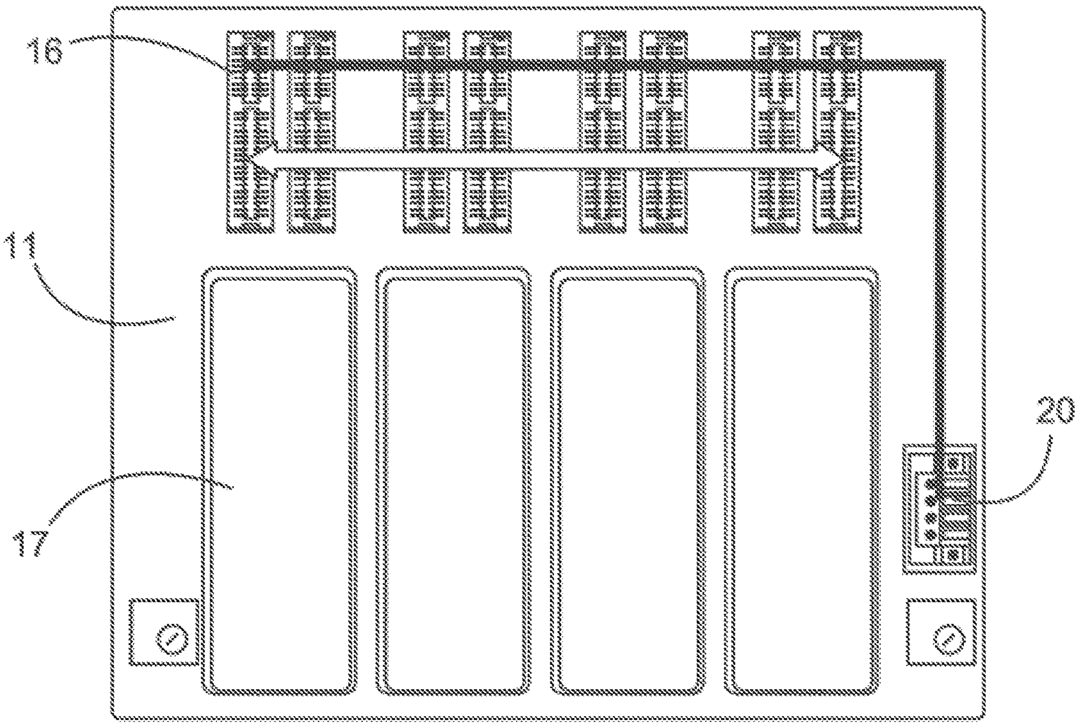
FIG. 3 is a top view of a module termination unit.

FIG. 2 and FIG. 3 show another embodiment of the present disclosure. FIG. 2 and FIG. 3 both show the same module termination unit 11. FIG. 2 shows an example of the module termination unit 11 with installed inlay elements 10 and controller modules 13. In FIG. 3, the module termination unit 11 is shown without any installed components.

The module termination unit 11 in FIG. 2 comprises four connection ports 16 and four respective recesses 17. Each inlay element 10 is assigned to a respective recess 17.

The recesses 17 have a rectangular shape. The shape of the recesses 17 corresponds to the shape of the inlay elements 10.

The inlay elements 10 are arranged in all four recesses 17. The inlay elements 10 in this embodiment differ from each other. More precisely, the second connector section 12*b* of each inlay element 10 comprises a different configuration. Here, the first inlay element 10 on the first position comprises RJ45 and USB sockets, the inlay elements 10 on the second and third position comprises RJ45 and D-SUB sockets and the inlay element 10 on the fourth position only comprises RJ45 sockets. The positions refer to the arrangement of the inlay elements 10 from left to right according to FIG. 2.

Two controller modules 13 are arranged on the module termination unit 11. An controller module 13 is arranged on the second position of the module termination unit 11 and a another controller module 13 is arranged on the fourth position of the module termination unit 11. The positions refer to the arrangement of the controller modules 13 from left to right according to FIG. 2. The controller modules 13 are connected with the module termination unit 11 by the connection ports 16 and by the connection interface 14 of the inlay elements 10.

In FIG. 3 the controller modules 13 and the inlay elements 10 are removed. FIG. 3 shows a line and an arrow. The line shows the connection of a power supply 20, which is arranged on the right side of the module termination unit 11, to the connector ports 16. The arrow shows the horizontal connection between the connection ports 16. In other words, the connection ports 16 are hard wired on a common circuit board of the module termination unit 11. This wiring provides high speed signals and larger number of signals between controller modules 13.

In the prior art, a single-wire point-to-point communication between single channel modules and generic input/output modules is possible. The module termination unit 11 with inlay elements 10 according to the present disclosure has a complex horizontal wiring, which allows bus and peer to peer communication between controller modules 13 and/or fieldbus communication interface modules and the field connection interfaces 15.

The inlay elements 10 further provide the possibility to individually configure the system. Meaning, the same type of module termination unit 11 may be used for multiple systems with different specifications. The module termination unit 10 may be customized by installing the respective inlay elements 10.

The inlay elements 10 according to the present disclosure are not signal connected or electrically connected to the module termination unit 11. This means, the inlay elements 10 form a bridge between the controller modules 13 and the connected fieldbus devices and/or a control network.

In summary, the present disclosure provides a flexible user configurable process controller system. The inlay elements 10 allow a lower number of variants for the module termination units 11.

A further advantage provided by the present disclosure is selective repair of the process control system, i.e. of the module termination unit 11. This means, that in case, that a user accessible field interface connector is damaged, only the respective inlay element 10 must be replaced. For this, the controller module 13 on the interface related to the respective inlay element 10 may also have to be removed. The remaining controller modules 13 and other modules on same module termination unit 11 can still operate without impact and can remain.

Any disclosure and embodiments described herein relate to the inlay element, the module termination unit, the input/output device, the modular process control system and the method, lined out above or below and vice versa. The benefits provided by any of the embodiments and examples equally apply to all other embodiments and examples and vice versa.

It shall be noted that all embodiments of the present disclosure concerning the method might be carried out with the order of the steps as described, nevertheless this has not to be the only and essential order of the steps of the method. The herein presented methods can be carried out with another order of the disclosed steps without departing from the respective method, unless explicitly mentioned to the contrary hereinafter.

Other variations to the disclosed embodiments can be understood and effected by those skilled in the art in practicing the claimed invention, from the study of the drawings, the disclosure, and the appended claims. In the claims, the word "comprising" does not exclude other elements or steps and the indefinite article "a" or "an" does not exclude a plurality. A single processor or other unit may fulfill the functions of several items or steps recited in the claims. The mere fact that certain measures are recited in mutually different dependent claims does not indicate that a combination of these measures cannot be used to advantage. Any reference signs in the claims should not be construed as limiting the scope of the claims.

LIST OF REFERENCES

10 inlay element
11 module termination unit
12*a* first connector section
12*b* second connector section
13 controller module
14 connection interface
15 fieldbus connection interface
16 connection port
17 recess
18 plate element
19*a* first cut-out
19*b* second cut-out
20 power supply In an embodiment, the first connector section comprises at least one connection interface for at least one controller module, for example a module fieldbus interface. In this way, the inlay element may be connected to controller module, e.g. a module fieldbus.

In an embodiment, the second connector section comprises at least one type of fieldbus connection interface for a fieldbus device. In this way, the inlay element may be connected to a fieldbus device.

In an embodiment, the fieldbus connection interface of the second connector section comprises one or more RJ45 sockets and/or D-SUB sockets and/or USB sockets.

Therefore, many different types of connections for the first and second connector sections may be provided. However, other types of connections are possible.

In an embodiment, the inlay element is configured to be connected to the module termination unit by form fitting, in particular by a latching mechanism. Form fitting, in particular latching, provides an easy way to arranging the inlay element removably in the module termination unit. Other connection means, for example screws, may also be possible.

In an embodiment, the inlay element my comprise a mechanical coding. For example, the inlay element may comprise tongues or protrusions which interact with corresponding receptacles and notches. This feature may prevent the insertion of a wrong inlay element into the wrong position in a module termination unit.

A further aspect of the present disclosure comprises a module termination unit comprising at least one connection port for housing at least one controller module and a recess, wherein the recess is configured to hold/house an inlay element, in particular an inlay element according to one of the above mentioned embodiments.

The module termination unit may be preferably a compact module termination unit. A compact module termination unit is a single module termination unit which can hold a certain number of controller modules. Module termination units may be designed to hold or several controller modules.

The recess and the inlay element correspond to each other. In particular the geometries of the recess and the inlay element correspond to each other. The recess may be configured to hold the inlay element by form fitting, for example by a latching mechanism. Other connection means are possible.

In an embodiment, the module termination unit is configured to have no direct signal connection and/or electrical connection to the inlay element. In this way, the connection ports of the module termination unit may be hard wired on one common printed circuit board assembly (PCBA) and may forward high speed communication signals and/or low speed or DC signals like slot identification-signals and power-signals.

In an embodiment, in an assembled state, the controller module is connected to the module termination unit via the connection port and to the inlay element via the connection interface. This provides a way to further modularize the module termination unit. As a result, it is possible to easily replace controller modules and it is also possible to replace the fieldbus connection interface without replacing the whole module termination unit.

In an embodiment, the connection ports are hard wired on a common circuit board of the module termination unit. This allows communication between the controller modules and/or fieldbus communication interface modules. The complex horizontal wiring allows bus and peer to peer communication between controllers and fieldbus communication interfaces.

In an embodiment, in an assembled state, the controller module arranged on the module termination unit is connected to a field device via the fieldbus connection interface of the inlay element. Alternatively, the controller module may be connected to a controller network.

A further aspect of the present disclosure relates to an input/output device comprising a module termination unit according to one of the above embodiments housing at least one controller module and an inlay element according to one of the above embodiments.

A further aspect of the present disclosure relates to a modular process control system comprising at least one input/output device as mentioned above, which is connected to one or more field devices.

A further aspect of the present disclosure relates to a method for assembling an input/output device according to the above embodiment comprising the following steps: providing a module termination unit according to any of the preceding embodiments; arranging an inlay element according to any of the above embodiments inside the recess of the module termination unit; connecting an controller module with the module termination unit and the inlay element by inserting the controller module into the respected sockets.

The respected sockets refer to the connections ports of the module termination unit and the field connection interface of the inlay element.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An input/output device, comprising:

an inlay element; and a module termination unit of a modular process control system comprising at least one connection port and a recess formed in the module termination unit that is configured to hold the inlay element, wherein the inlay element is configured to be arranged inside the recess of the module termination unit of the modular process control system, wherein the module termination unit has no direct signal connection and/or electrical connection to the inlay element, and wherein the inlay element comprises:

a first connector section; and a second connector section;

wherein the first connector section is configured to be connected to at least one controller module, wherein the first connector section comprises at least one connection interface for the at least one controller module; and wherein the second connector section is configured to be connected to at least one fieldbus device or to a control network, wherein the at least one controller module is connected to the module termination unit by the at least one connection port and to the inlay element by the at least one connection interface, and wherein the inlay element forms a bridge between the at least one controller module and a connected fieldbus device or connected control network.

2. The input/output device according to claim 1, wherein the at least one controller module is a module fieldbus interface.

3. The input/output device according to claim 1, wherein the second connector section comprises at least one type of fieldbus connection interface for a fieldbus device.

4. The input/output device according to claim 3, wherein the fieldbus connection interface of the second connector section comprises one or more RJ45 sockets, D-SUB sockets, or USB sockets.

5. The input/output device according to claim 1, wherein the inlay element is configured to be connected to the module termination unit by form fitting.

6. The input/output device according to claim 5, wherein the form fitting includes a latching mechanism.

7. A module termination unit, comprising:

a connection port for housing at least one input/output unit;

a recess formed in the termination unit, wherein the recess is configured to hold an inlay element;

wherein the inlay element comprises:

a first connector section, wherein the first connector section comprises a connection interface for a controller module; and a second connector section, wherein the first connector section is configured to be connected to the controller module, wherein the second connector section is configured to be connected to a fieldbus device or to a control network, wherein the controller module is connected to the module termination unit by the connection port and to the inlay element by the connection interface, wherein the inlay element is configured to be arranged inside the recess of the module termination unit, the module termination unit has no direct signal connection and/or electrical connection to the inlay element, and wherein the inlay element forms a bridge between the controller module and a connected fieldbus device or connected control network.

8. The module termination unit according to claim 7, wherein the connection port is hard wired on a common circuit board of the module termination unit.

9. The module termination unit according to claim 7, wherein, in an assembled state, a controller module is arranged on the module termination unit and is connected to a field device via the fieldbus connection interface of the inlay element.

10. A method for assembling an input/output device, comprising:

providing a module termination unit, the module termination unit comprising at least one connection port for housing at least one input/output unit and a recess formed in the termination unit, wherein the recess is configured to hold an inlay element, wherein the module termination unit has no direct signal connection and/or electrical connection to the inlay element;

arranging an inlay element inside the recess of the module termination unit, the inlay element comprising a first connector section and a second connector section, wherein the first connector section is configured to be connected to a controller module, wherein the first connector section comprises at least one connection interface for the controller module, and wherein the second connector section is configured to be connected to a fieldbus device or to a control network, wherein the inlay element forms a bridge between the controller module and a connected fieldbus device or connected control network; and connecting the controller module with the module termination unit and the inlay element by inserting controller module into a respective socket by the at least one connection port and the at least one connection interface.

* * * * *